United States Patent
Lee

(10) Patent No.: US 12,216,173 B2
(45) Date of Patent: Feb. 4, 2025

(54) METHOD FOR DETECTING DEFECTIVE BATTERY CELL AND BATTERY MANAGEMENT SYSTEM PROVIDING THE SAME

(71) Applicant: LG Energy Solution, Ltd., Seoul (KR)

(72) Inventor: Bokyun Lee, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 0 days.

(21) Appl. No.: 18/025,428

(22) PCT Filed: Jul. 27, 2022

(86) PCT No.: PCT/KR2022/011039
§ 371 (c)(1),
(2) Date: Mar. 9, 2023

(87) PCT Pub. No.: WO2023/008904
PCT Pub. Date: Feb. 2, 2023

(65) Prior Publication Data
US 2024/0019497 A1 Jan. 18, 2024

(30) Foreign Application Priority Data
Jul. 30, 2021 (KR) .................. 10-2021-0100431

(51) Int. Cl.
*G01R 31/392* (2019.01)
*G01R 31/367* (2019.01)
(Continued)

(52) U.S. Cl.
CPC ......... *G01R 31/392* (2019.01); *G01R 31/367* (2019.01); *G01R 31/382* (2019.01);
(Continued)

(58) Field of Classification Search
CPC .............. G01R 31/392; G01R 31/3835; G01R 31/396; G01R 31/367; G01R 31/382;
(Continued)

(56) References Cited

U.S. PATENT DOCUMENTS

2009/0091332 A1 4/2009 Emori et al.
2012/0262180 A1 10/2012 Ishishita
(Continued)

FOREIGN PATENT DOCUMENTS

JP 2000152515 A 5/2000
JP 2002345158 A 11/2002
(Continued)

OTHER PUBLICATIONS

Extended European Search Report including Written Opinion for Application No. 22849880.4 dated Apr. 5, 2024, pp. 1-8.
(Continued)

*Primary Examiner* — Raul J Rios Russo
(74) *Attorney, Agent, or Firm* — Lerner David LLP

(57) ABSTRACT

A system and method for detecting a detective battery cell among a plurality of battery cells that form a battery. The system includes: a cell monitoring IC that measures a cell voltage of each of the battery cells, and a main control circuit that detects a charge battery cell of which a cell voltage first reaches a charge final voltage, detects a discharge battery cell of which a cell voltage first reaches a discharge final voltage among the plurality of battery cells, and when the number of charge cycles and the number of discharge cycles satisfies a first reference count, detects a battery cell for which the sum of times the battery cell is the charge battery cell and times the battery cell is the discharge battery cell meets or exceeds second count as the defective battery cell.

16 Claims, 3 Drawing Sheets

(51) Int. Cl.
*G01R 31/382* (2019.01)
*G01R 31/3835* (2019.01)
*G01R 31/396* (2019.01)
*G06F 15/16* (2006.01)
*G06F 15/173* (2006.01)
*H02J 7/00* (2006.01)

(52) U.S. Cl.
CPC ....... *G01R 31/3835* (2019.01); *G01R 31/396* (2019.01); *H02J 7/0013* (2013.01); *H02J 7/0047* (2013.01); *H02J 7/007182* (2020.01); *G06F 15/161* (2013.01); *G06F 15/17306* (2013.01)

(58) Field of Classification Search
CPC .. H02J 7/0013; H02J 7/0047; H02J 7/007182; H02J 7/00712; Y02E 60/10; G06F 15/161; G06F 15/17306
USPC ......................................................... 324/434
See application file for complete search history.

(56) References Cited

U.S. PATENT DOCUMENTS

| | | |
|---|---|---|
| 2014/0015537 A1 | 1/2014 | Uchida et al. |
| 2015/0120225 A1 | 4/2015 | Kim |
| 2015/0369876 A1 | 12/2015 | Kobayashi |
| 2017/0018821 A1* | 1/2017 | Springer ................. H02J 7/005 |
| 2017/0214255 A1* | 7/2017 | Hartmann ........... H01M 10/441 |
| 2017/0214256 A1 | 7/2017 | Hardy |
| 2019/0229381 A1* | 7/2019 | Hwang ............... H01M 10/425 |
| 2020/0408849 A1 | 12/2020 | Kim et al. |
| 2022/0390521 A1 | 12/2022 | Kim et al. |

FOREIGN PATENT DOCUMENTS

| | | |
|---|---|---|
| JP | 2004014205 A | 1/2004 |
| JP | 3763268 B2 | 4/2006 |
| JP | 2009089488 A | 4/2009 |
| JP | 5733275 B2 | 6/2015 |
| JP | 6102609 B2 | 3/2017 |
| JP | 2022551451 A | 12/2022 |
| KR | 101509001 B1 | 4/2015 |
| KR | 20210001724 A | 1/2021 |
| KR | 102284355 B1 | 8/2021 |

OTHER PUBLICATIONS

International Search Report for Application No. PCT/KR2022/011039 mailed Nov. 9, 2022, pp. 1-3.

* cited by examiner

METHOD FOR DETECTING DEFECTIVE BATTERY CELL AND BATTERY MANAGEMENT SYSTEM PROVIDING THE SAME

CROSS-REFERENCE TO RELATED APPLICATIONS

The present application is a national phase entry under 35 U.S.C. § 371 of International Application No. PCT/KR2022/011039 filed Jul. 27, 2022, which claims priority from Korean Patent Application No. 10-2021-0100431 filed Jul. 30, 2021, all of which are incorporated herein by reference.

TECHNICAL FIELD

The present invention relates to a method for detecting a defective battery cell in a plurality of battery cells, and a battery management system providing the method.

BACKGROUND ART

An electric vehicle is a vehicle that operates with electrical energy output from a battery composed of a predetermined number, for example, two to four, battery packs. The battery includes a plurality of battery cells that can be charged/discharged and can cause a change in state by an external environment and its own characteristics. Accordingly, a battery management system (BMS) monitors and manages a plurality of battery cells included in the battery.

When each of the plurality of battery cells has performance within a predetermined range (hereinafter, battery cells within a normal range), the cell voltage of each of the plurality of battery cells varies similarly within a predetermined range in the charging cycle and in the discharge cycle. Accordingly, although the BMS terminates the charging cycle at the first occurrence in which a battery cell of which a voltage reaches the charge final voltage first, the battery may use all of the available battery capacity.

On the other hand, when the battery is used for a long period of time, the battery cell is deteriorated and thus a battery cell (hereinafter, referred to as a defective battery cell) that deviates from the performance within a predetermined range may occur. In a charge cycle or a discharge cycle, a cell voltage of a defective battery cell may have a characteristic in which it reaches the charge final voltage or discharge final voltage faster than the cell voltage of a battery cell in other normal ranges.

When the charging cycle is terminated when the cell voltage of the defective battery cell reaches the charge final voltage, the battery cell within the other normal range may be charged without being sufficiently charged. As a result, a problem that the battery cannot use all of the available battery capacity occurs. In addition, since defective battery cells repeatedly use the entire range of usable capacity, a problem that deterioration is accelerated occurs. In addition, when a defect occurs in a battery cell, which is a basic unit that forms the battery, the entire voltage of the battery will drop, causing frequent cell balancing and under voltage (UV) diagnosis, thereby threatening the stability of the entire battery.

SUMMARY

Technical Problem

The present invention is to provide a method for detecting a defective battery cell that can detect a defective battery cell causing deterioration of battery performance, and a battery management system providing the method.

Technical Solution

A battery management system according to one aspect of the present invention detects a detective battery cell in a battery including a plurality of battery cells, and includes: a cell monitoring integrated circuit (IC) that is connected to opposite ends of each battery cell of the plurality of battery cells and is configured to measure a respective cell voltage of each battery cell of the plurality of battery cells; and a main control circuit configured to, for each battery cell of the plurality of battery cells: for each charge/discharge cycle of the battery: detect whether a cell voltage of the battery cell reaches a charge final voltage before any other battery cell of the plurality of battery cells, and detect whether the cell voltage of the battery cell reaches a discharge final voltage before any other battery cell of the plurality of battery cells, when a number of the charge/discharge cycles satisfies a first reference count, determine a first count of how many times the battery cell reaches the charge final voltage before any other battery cell of the plurality of battery cells, and a second count of how many times the battery cell reaches the discharge final voltage before any other battery cell of the plurality of battery cells, and determine that the battery cell is defective in response to a total of the first count and the second count being greater than or equal to a second reference count.

The main control circuit may be configured to terminate charging in response to the battery cell reaching the charge final voltage before any other battery cell of the plurality of battery cells.

The main control circuit may be configured to terminate discharging in response to the battery cell reaching the discharge final voltage before any other battery cell of the plurality of battery cells.

A battery management system according to another aspect of the present invention detects a defective battery cell in a battery including a plurality of battery cells, and includes: a cell monitoring IC that is connected to opposite ends of each battery cell of the plurality of battery cells and is configured to measure a respective cell voltage of each battery cell of the plurality of battery cells; and a main control circuit configured to, for each battery cell of the plurality of battery cells: for each charge/discharge cycle of the battery: detect whether a cell voltage of the battery cell reaches a charge final voltage before any other battery cell of the plurality of battery cells, and detect whether the cell voltage of the battery cell reaches a discharge final voltage before any other battery cell of the plurality of battery cells, and when a number of the charge/discharge cycles satisfies a first reference count, determine that the battery cell is defective in response to the battery cell reaching the charge final voltage before any other battery cell of the plurality of battery cells and reaching the discharge final voltage before any other battery cell of the plurality of battery cells within consecutive charge/discharge cycles of the battery.

The main control circuit may be configured to determine that the battery cell is defective further in response to the battery cell reaching the discharge final voltage before any other battery cell of the plurality of battery cells prior to the battery cell reaching the charge final voltage before any other battery cell of the plurality of battery cells.

The main control circuit may be configured to terminate charging in response to the battery cell reaching the charge final voltage before any other battery cell of the plurality of battery cells.

The main control circuit may be configured to terminate discharging in response to the battery cell reaching the discharge final voltage before any other battery cell of the plurality of battery cells.

The main control circuit may be configured to determine that the battery cell is defective further in response to the battery cell reaching the charge final voltage before any other battery cell of the plurality of battery cells prior to the battery cell reaching the discharge final voltage before any other battery cell of the plurality of battery cells A method for detecting whether a battery cell is defective according to another aspect of the present invention includes: for each charge/discharge cycle of the battery: detecting whether a cell voltage of the battery cell reaches a charge final voltage before any other battery cell of the plurality of battery cells; and detecting whether the cell voltage of the battery cell reaches a discharge final voltage before any other battery cell of the plurality of battery cells; determining a number of charge/discharge cycles reaches a first reference count; and in response to the number of charge/discharge cycles reaching the first reference count, determining a first count of how many times the battery cell reaches the charge final voltage before any other battery cell of the plurality of battery cells, and a second count of how many times the battery cell reaches the discharge final voltage before any other battery cell of the plurality of battery cells; and determining that the battery cell is defective in response to a total of the first count and the second count being greater than or equal to a second reference count.

The method may include terminating charging in response to the battery cell reaching the charge final voltage before any other battery cell of the plurality of battery cells.

The method may be configured to include terminating discharging in response to the battery cell reaching the discharge final voltage before any other battery cell of the plurality of battery cells.

A method for detecting a whether a battery cell is defective according to another aspect of the present invention includes: for each charge/discharge cycle of the battery: detecting whether a cell voltage of the battery cell reaches a charge final voltage before any other battery cell of the plurality of battery cells; and detecting whether the cell voltage of the battery cell reaches a discharge final voltage before any other battery cell of the plurality of battery cells; determining a number of charge/discharge cycles reaches a first reference count; and when the number of the charge/discharge cycles reaches the first reference count, determining that the battery cell is defective in response to the battery cell reaching the charge final voltage before any other battery cell of the plurality of battery cells and reaching the discharge final voltage before any other battery cell of the plurality of battery cells within consecutive charge/discharge cycles of the battery.

Determining that the battery cell is defective may be further in response to the battery cell reaching the discharge final voltage before any other battery cell of the plurality of battery cells prior to the battery cell reaching the charge final voltage before any other battery cell of the plurality of battery cells.

The method may include terminating charging in response to the battery cell reaching the charge final voltage before any other battery cell of the plurality of battery cells.

The method may include terminating discharging in response to the battery cell reaching the discharge final voltage before any other battery cell of the plurality of battery cells.

Determining that the battery cell is defective may be further in response to the battery cell reaching the charge final voltage before any other battery cell of the plurality of battery cells prior to the battery cell reaching the discharge final voltage before any other battery cell of the plurality of battery cells

Advantageous Effects

The present invention can improve the stability of the battery by quickly and accurately detecting a defective battery cell, and prevent deterioration of the battery performance

DETAILED DESCRIPTION

Figure 1:
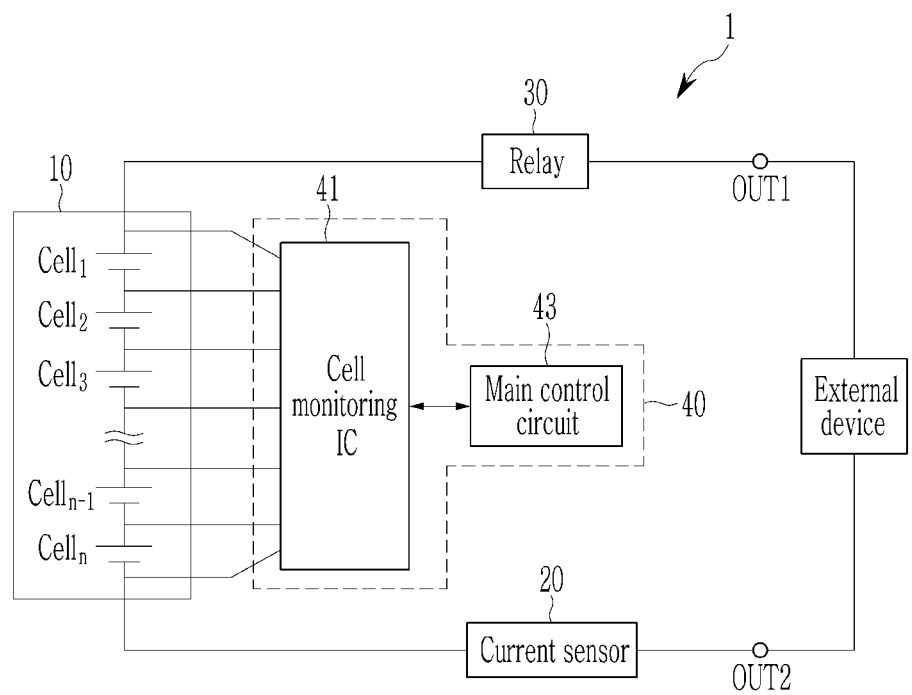
FIG. 1 is provided for description of a battery system according to an embodiment.

Hereinafter, referring to the drawings, the embodiment disclosed in the present specification will be described in detail, but the same or similar constituent elements are given the same and similar reference numerals, and duplicated descriptions thereof will be omitted. The suffixes "module" and/or "part" for constituent elements used in the following description are given or mixed in consideration of only the ease of specification writing, and do not have distinct meanings or roles by themselves. In addition, in describing the embodiment disclosed in the present specification, when it is determined that a detailed description of a related known technology may obscure the gist of the embodiment disclosed in this specification, the detailed description is omitted. In addition, the attached drawing is only for easy understanding of the embodiment disclosed in this specification, and the technical idea disclosed in this specification is not limited by the attached drawing, and all changes included in the spirit and technical range of the present invention should be understood to include equivalents or substitutes.

Terms including ordinal numbers such as first, second, and the like may be used to describe various configurations elements, but the constituent elements are not limited by the terms. The terms are only used for the purpose of distinguishing one constituent element from another.

It should be understood that when one constituent factor is referred to as being "coupled to" or "connected to" another constituent factor, one constituent factor can be directly coupled to or connected to the other constituent factor, but intervening factors may also be present. By contrast, when one constituent factor is referred to as being "directly coupled to" or "directly connected to" another constituent factor, it should be understood that there are no intervening factors.

In the present application, it will be appreciated that terms "including" and "having" are intended to designate the existence of characteristics, numbers, steps, operations, constituent factors, and components described in the specification or a combination thereof, and do not exclude a possibility of the existence or addition of one or more other characteristics, numbers, steps, operations, constituent factors, and components, or a combination thereof in advance.

FIG. 1 is provided for description of a battery system according to an embodiment.

Referring to FIG. 1, a battery system 1 includes a battery 10, a current sensor 20, a relay 30, and a battery management system (hereinafter, referred to as BMS) 40.

The battery 10 may include a plurality of battery cells Cell1 to Celln that are electrically coupled in parallel and series. In some embodiment, the battery cell may be a rechargeable battery. A predetermined number of battery cells are coupled in series such that a battery module is formed, a predetermined number of battery modules are coupled in series such that a battery pack is formed, and a predetermined number of battery packs are coupled in parallel such that a battery bank is formed, thereby supplying a desired amount of power. In FIG. 1, a battery 10 in which a plurality of battery cells Cell1 to Celln are coupled in series is illustrated, but this is not restrictive. The battery 10 may be formed in a unit of a battery module, a battery pack, or a battery bank.

Each of the plurality of battery cells Cell1 to Celln is electrically connected to the BMS 40 through a wire. The BMS 40 collects and analyzes various information about a battery cell including information about the plurality of battery cells Cell1 to Celln to control the charging and discharging of the battery cell, a protection operation, and the like, and control the operation of the relay 30.

In FIG. 1, the battery 10 includes the plurality of battery cells Cell1 to Celln connected in series and connected between two output terminals OUT1 and OUT2 of the battery system 1, the relay 30 is connected between a positive electrode and a first output terminal OUT1 of the battery system 1, and a current sensor 20 is connected between a negative electrode and a second output terminal OUT2 of the battery system 1. The connection relationship between the components and the components shown in FIG. 1 is an example of the invention, and is not limited thereto.

The current sensor 20 is connected in series to a current path between the battery 10 and an external device. The current sensor 20 may measure a battery current flowing through the battery 10, that is, a charging current and a discharge current of the battery 10, and may transmit a measurement result to the BMS 40.

The relay 30 controls the electrical connection between the battery system 1 and the external device. When the relay 30 is turned on, the battery system 1 and the external device are electrically connected and thus charging and discharging are carried out, and when the relay 30 is turned off, the battery system 1 and the external device are electrically separated. In this case, the external device may be a charger in a charging cycle in which the battery 10 is charged by supplying power, and may be a load in a discharge cycle in which the battery 10 discharges power to the external device.

The BMS 40 includes a cell monitoring integrated circuit (IC) 41 and a main control circuit 43.

The cell monitoring IC 41 is electrically connected to a positive electrode and a negative electrode of each of the plurality of battery cells Cell1 to Celln, and measures a cell voltage of each of the plurality of battery cells Cell1 to Celln. A battery current value measured by the current sensor 20 may be transmitted to the cell monitoring IC 41. The cell monitoring IC 41 transmits information about the measured cell voltage and battery current to the main control circuit 43. Specifically, the cell monitoring IC 41 measures the cell voltage of each of the plurality of battery cells Cell1 to Celln every predetermined period during a rest period in which charging and discharging do not occur, and the cell current can be calculated based on the measured cell voltage. The cell monitoring IC 41 may transmit the cell voltage and the cell current of each of the plurality of battery cells Cell1 to Celln to the main control circuit 43.

When counts of charge/discharge cycles satisfy a first reference count, the main control circuit 43 may detect a defective battery cell based on the charge battery cell and the discharge battery cell.

The charge battery cell may indicate a battery cell in which a cell voltage first reaches a charge final voltage in a charge cycle. The discharge battery cell may indicate a discharge battery cell in which a cell voltage first reaches a discharge final voltage in a discharge cycle. For example, the main control circuit 43 may use an electrical position of the battery cell in the battery 10 as an identification factor of the battery cell.

Figure 2:
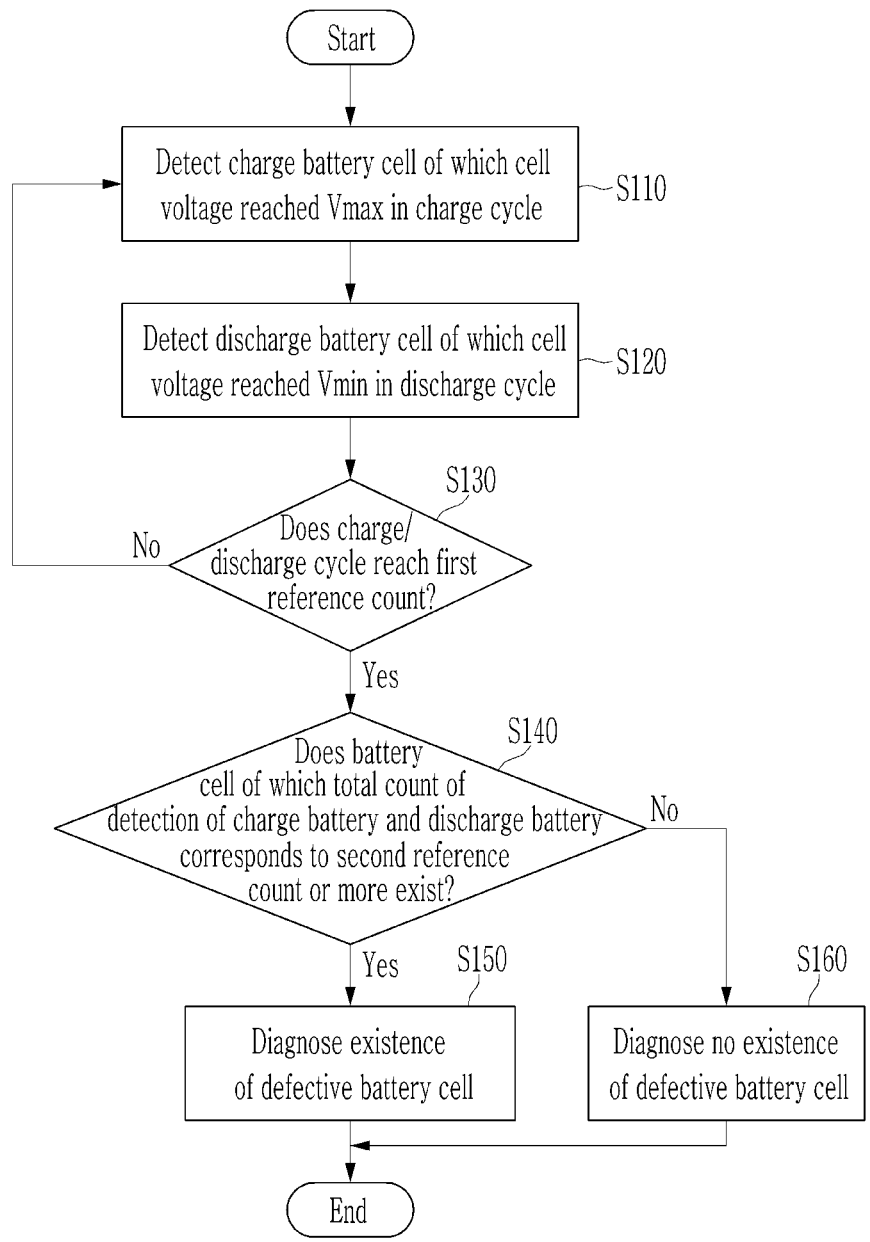
FIG. 2 is a flowchart that describes a detection method of a defective battery cell according to the embodiment.

FIG. 2 is a flowchart that describes a detection method of a defective battery cell according to the embodiment.

Hereinafter, referring to FIG. 1 and FIG. 2, a detection method of a defective battery cell and a battery management system that provides the detection method according to the embodiment will be described in detail.

First, the BMS 40 detects a charge battery cell that reached the charge final voltage Vmax first among the plurality of battery cells Cell1 to Celln for each charging cycle that charges the battery 10 with the power of the external device (S110).

The charge final voltage Vmax may be a maximum voltage to which the battery 10 can be charged in a non-hazardous range. The higher the charge final voltage Vmax, the higher the capacity of the battery 10 can be, but overcharge may cause a danger in the battery 10. Accordingly, the charge final voltage may be appropriately set in consideration of the capacity and stability of the battery 10.

The BMS 40 may use the electrical position of the battery cell as an identification factor of the battery cell. For example, in an N-th charging cycle, the BMS 40 checks the electrical position of the battery cell in which the cell voltage first reaches the charge final voltage Vmax among the plurality of battery cells Cell1 to Celln, and may add one detection count with respect to a cell of the corresponding position.

The BMS 40 may terminate the charging cycle when a charge battery cell is detected. Then, it is possible to prevent the accelerated deterioration of the charge battery cell by blocking an overcharge state in which the charge battery cell is continuously charged until the cell voltage of the remaining battery cells except the charge battery cell reaches the charge final voltage Vmax.

Next, the BMS 40 detects the discharge battery cell in which the cell voltage first reaches a discharge final voltage Vmin in the discharge cycle for supplying the discharged power of the battery 10 to the external device (S120).

The discharge lower limit voltage Vmin may be a minimum voltage to which the battery 10 can be discharged in a range in which the battery 10 is not in danger. As the discharge lower limit voltage Vmin is lower, the capacity of the battery 10 may increase, but over-discharge may case the battery 10 to be in danger. Accordingly, the discharge final voltage Vmin may be appropriately set in consideration of the capacity and stability of the battery 10. For example, the discharge final voltage may be referred to as a cut-off voltage.

The BMS 40 may use the electrical position of the battery cell in the battery 10 as an identification factor of the battery cell. For example, in an N-th discharge cycle, the BMS 40 checks a position of the battery cell in which the cell voltage first reaches the discharge final voltage Vmin among a plurality of battery cells Cell1 to Celln, and adds the detection counts with respect to the battery cell of the corresponding position by one time.

The BMS 40 may terminate the discharge cycle when a discharge battery cell is detected. Then, the over-discharge state in which the discharge battery cell is continuously discharged is blocked until the cell voltage of the remaining battery cells except the discharge battery cell reaches the discharge final voltage, thereby preventing acceleration of the deterioration of the discharge battery cell.

Next, the BMS 40 determines whether the sum of the charge cycle count and the discharge cycle count satisfies a first reference count (S130).

The first reference count may correspond to an optimal number of charge and discharge cycles for detecting a defective battery cell. For example, the first reference count may be derived by a predetermined experiment.

When the determination result shows that the sum of the charge and discharge cycle counts does not satisfy the first reference count (S130, No), the BMS 40 repeats from step S110.

When the determination result shows that the sum of the charge and discharge cycle counts satisfies the first reference count (S130, Yes), the BMS 40 determines whether there is a battery cell of which a total count that is the sum of the first count detected by the charge battery cell and the second count detected by the discharge battery cell corresponds to a second reference count or more (S140).

For example, it is assumed that the battery 10 includes five battery cells Cell1, Cell2, Cell3, Cell4, and Cell5 and the first reference count is 500 times and the second reference count is 300 times. When it is determined that a total of 400 times for a third battery cell (e.g., detected 200 times with a charge battery cell and detected 200 times with a discharge battery cell), 25 times for each of the first, second, fourth, and fifth battery cells (e.g., detected 12 times with a charge battery cell and detected 13 times with a discharge battery cell), the BMS 40 may determine that a battery cell corresponding to two or more reference counts exists.

Next, when the determination result shows that a battery cell of which a total count corresponds to the second reference count exists (S140, Yes), the BMS 40 diagnoses that a defective battery cell exists among the plurality of battery cells (S150).

For example, the BMS 40 may detect the third battery cell Cell3 of which a total count corresponds to the second reference count as a defective battery cell. Depending on embodiments, the defective battery cell may be a battery cell corresponding to a lower than a predetermined performance due to deterioration of the battery cell.

Next, the determination result shows that a battery cell of which the total count corresponds to the second reference count does not exist (S140, No), the BMS 40 diagnosis that no defective battery cell exists in the plurality of battery cells (S160).

Figure 3:
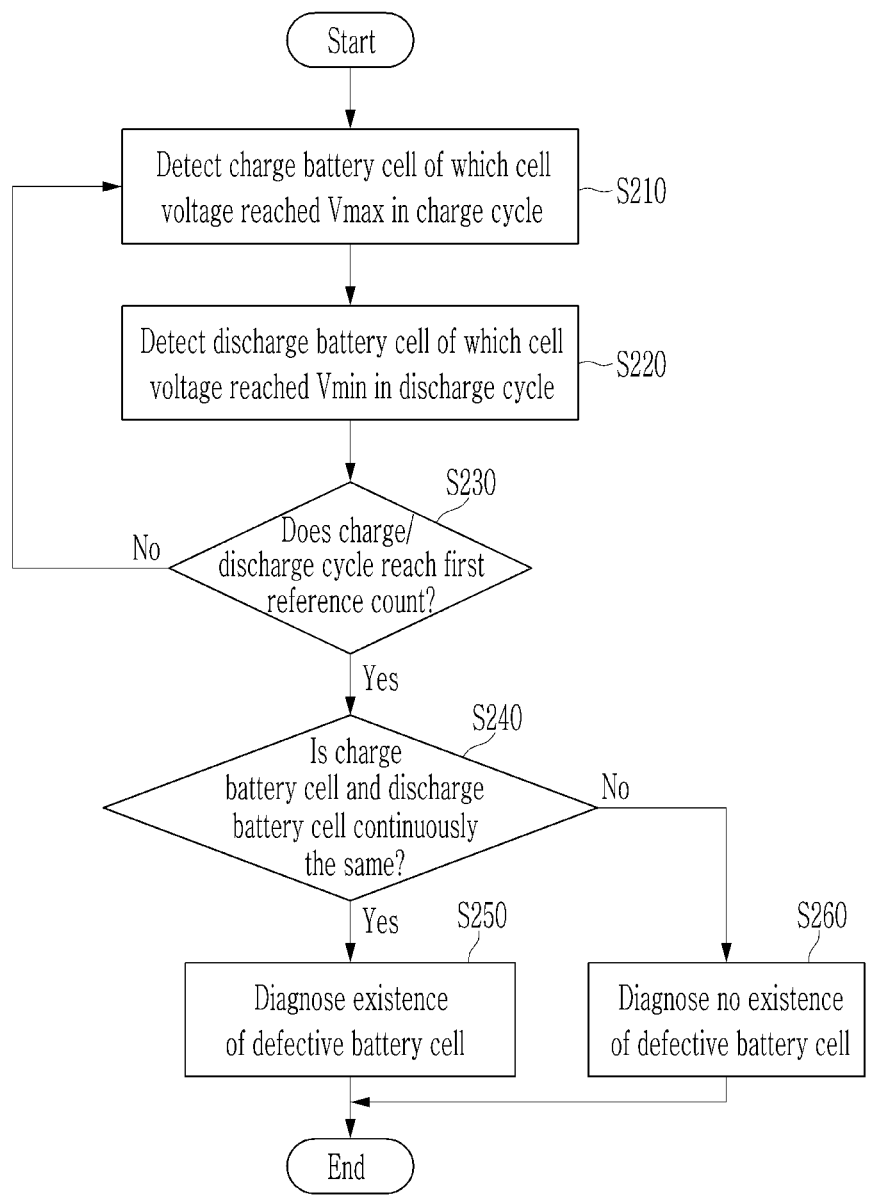
FIG. 3 is a flowchart for description of a detection method of another defective battery cell according to another embodiment.

FIG. 3 is a flowchart for description of a detection method of another defective battery cell according to another embodiment.

Hereinafter, referring to FIG. 1 and FIG. 3, a method for detecting a defective battery cell, and a battery management system providing the method, will be described in detail.

First, a BMS 40 detects a charge battery cell in which a cell voltage first reaches a charge final voltage Vmax in a charging cycle for charging a battery 10 with power of an external device (S210).

The charge final voltage Vmax may be a maximum voltage (Max Voltage) to which the battery 10 can be charged in a non-hazardous range. The higher the charge final voltage Vmax, the higher the capacity of the battery 10 can be, but overcharge may cause the battery 10 to be in danger. Accordingly, the charging final limit voltage may be appropriately set in consideration of the capacity and stability of the battery 10.

The BMS 40 may use an electrical position of the battery cell as an identification factor of the battery cell. For example, in an N-th charge cycle, the BMS 40 checks a position of the battery cell in which the cell voltage first reaches the charge final voltage Vmax among a plurality of battery cells Cell1 to Celln, and adds the number of detections to the battery cell of the corresponding position by one time.

The BMS 40 may terminate the charge cycle when a charge battery cell is detected. Then, an over-charge state in which the charge battery cell is continuously charged is blocked until the cell voltage of the remaining battery cells except the charge battery cell reaches the charge final voltage Vmax, thereby preventing acceleration of the deterioration of the charge battery cell.

Next, the BMS 40 detects a discharge battery cell in which a cell voltage first reaches a discharge final voltage Vmin in a discharge cycle for supplying discharged power of the battery 10 to the external device (S220).

The discharge final voltage Vmin may be a minimum voltage (MM Voltage) capable of discharging the battery 10 in a non-hazardous range. As the discharge final voltage Vmin is lowered, the capacity of the battery 10 may increase, but over-discharge may cause the battery 10 to be in danger. Accordingly, the discharge final voltage Vmin may be appropriately set in consideration of the capacity and stability of the battery 10. For example, the discharge final voltage may be referred to as a cut-off voltage.

The BMS 40 may use the electrical position of the battery cell in the battery 10 as an identification factor of the battery cell. For example, in an N-th discharge cycle, the BMS 40 checks a position of the battery cell in which the cell voltage first reaches the discharge final voltage Vmin among a plurality of battery cells Cell1 to Celln, and adds the number of detections to the battery cell of the corresponding position by one time.

The BMS 40 may terminate the discharge cycle when a discharge battery cell is detected. Then, the over-discharge state in which the discharge battery cell is continuously discharged is blocked until the cell voltage of the remaining battery cells except the discharge battery cell reach the discharge final voltage, thereby preventing acceleration of the deterioration of the discharge battery cell.

Next, the BMS 40 determines whether the sum of the charge cycle count and the discharge cycle count satisfies a first reference count (S230).

The first reference count may correspond to an optimal charge and discharge cycle counts for detecting a defective battery cell. For example, the first reference count may be derived by a predetermined experiment.

When the determination result shows that the sum of the charge and discharge cycle counts does not satisfy the first reference count (S130, No), the BMS 40 repeats from step S210.

When the determination result shows that the sum of the charge and discharge cycle counts satisfies the first reference count (S230, Yes), the BMS 40 determines whether the charge battery cell and the discharge battery cell continuously correspond to the same battery cell (S240).

According to the embodiment, when a battery cell detected as a charge battery cell in the N-th charging cycle and then detected as a discharge battery cell in the (N+1)-th discharge cycle exists, the BMS 40 may determine that the charging battery cell and the discharge battery cell continuously correspond to the same battery cell.

According to another embodiment, when a battery cell detected as a discharge battery cell in the N-th discharge cycle and detected as a charge battery cell in the (N+1)-th charging cycle exists, the BMS 40 may determine that the charging battery cell and the discharge battery cell continuously correspond to the same battery cell.

Assume that battery 10 includes five battery cells Cell1, Cell2, Cell3, Cell4, and Cell5, and the first reference count is 500. For example, when the fourth battery cell Cell4 is detected as a charge battery cell in the 35th charge cycle and then is detected as a discharge battery cell in the 36th discharge cycle, the BMS 40 may determine that the charge battery cell and the discharge battery cell continuously correspond to the same battery cell. For another example, when the fifth battery cell Cell5 is detected as a discharge battery cell in the 37th discharge cycle and then is detected as a charge battery cell in the 38th charge cycle, the BMS 40 may determine that the charge battery cell and the discharge battery cell continuously correspond to the same battery cell.

Next, when the determination result shows that the charge battery cell and the discharge battery cell continuously correspond to the same battery cell (S240, Yes), the BMS 40 diagnoses that a defective battery cell exists among a plurality of battery cells (S250).

For example, the BMS 40 may determine the fourth battery cell Cell4 that is detected as a charge battery cell in the 35$^{th}$ charging cycle and then detected as a discharge battery cell in the 36$^{th}$ discharge cycle as a defective battery cell. As another example, the BMS 40 may determine the fifth battery cell Cell5 that is detected as a discharge battery cell in the 37$^{th}$ discharging cycle and then detected as a charge battery cell in the 38$^{th}$ charge cycle as a defective battery cell. Depending on embodiments, the defective battery cell may be a battery cell corresponding to a lower than predetermined performance due to deterioration of the battery cell.

Next, when the determination result shows that the charge battery cell and the discharge battery cell do not continuously correspond to the same battery cell (S240, No), the BMS 40 diagnoses that a defective battery cell does not exist among the plurality of battery cells (S260).

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

The invention claimed is:

1. A battery management system that detects a defective battery cell in a battery including a plurality of battery cells, comprising:
 a cell monitoring integrated circuit (IC) that is connected to opposite ends of each battery cell of the plurality of battery cells and is configured to measure a respective cell voltage of each battery cell of the plurality of battery cells; and
 a main control circuit configured to, for each battery cell of the plurality of battery cells:
  for each charge/discharge cycle of the battery:
   detect whether a cell voltage of the battery cell reaches a charge final voltage before any other battery cell of the plurality of battery cells, and
   detect whether the cell voltage of the battery cell reaches a discharge final voltage before any other battery cell of the plurality of battery cells,
  when a number of the charge/discharge cycles satisfies a first reference count, determine a first count of how many times the battery cell reaches the charge final voltage before any other battery cell of the plurality of battery cells, and a second count of how many times the battery cell reaches the discharge final voltage before any other battery cell of the plurality of battery cells, and
  determine that the battery cell is defective in response to a total of the first count and the second count being greater than or equal to a second reference count.

2. The battery management system of claim 1, wherein the main control circuit is configured to terminate charging in response to the battery cell reaching the charge final voltage before any other battery cell of the plurality of battery cells.

3. The battery management system of claim 1, wherein the main control circuit is configured to terminate discharging in response to the battery cell reaching the discharge final voltage before any other battery cell of the plurality of battery cells.

4. A battery management system that detects a defective battery cell in a battery including a plurality of battery cells, comprising:
 a cell monitoring IC that is connected to opposite ends of each battery cell of the plurality of battery cells and is configured to measure a respective cell voltage of each battery cell of the plurality of battery cells; and
 a main control circuit configured to, for each battery cell of the plurality of battery cells:
  for each charge/discharge cycle of the battery:
   detect whether a cell voltage of the battery cell reaches a charge final voltage before any other battery cell of the plurality of battery cells, and
   detect whether the cell voltage of the battery cell reaches a discharge final voltage before any other battery cell of the plurality of battery cells, and
  when a number of the charge/discharge cycles satisfies a first reference count, determine that the battery cell is defective in response to the battery cell reaching the charge final voltage before any other battery cell of the plurality of battery cells and reaching the discharge final voltage before any other battery cell of the plurality of battery cells within consecutive charge/discharge cycles of the battery.

5. The battery management system of claim 4, wherein the main control circuit is configured to determine that the battery cell is defective further in response to the battery cell reaching the discharge final voltage before any other battery cell of the plurality of battery cells prior to the battery cell reaching the charge final voltage before any other battery cell of the plurality of battery cells.

6. The battery management system of claim 4, wherein the main control circuit is configured to terminate charging in response to the battery cell reaching the charge final voltage before any other battery cell of the plurality of battery cells.

7. The battery management system of claim 4, wherein the main control circuit is configured to terminate discharging in response to the battery cell reaching the discharge final voltage before any other battery cell of the plurality of battery cells.

8. The battery management system of claim 4, wherein the main control circuit is configured to determine that the battery cell is defective further in response to the battery cell reaching the charge final voltage before any other battery cell of the plurality of battery cells prior to the battery cell reaching the discharge final voltage before any other battery cell of the plurality of battery cells.

9. A method for detecting whether a battery cell in a battery including a plurality of battery cells is defective, by a battery management system, comprising:
for each charge/discharge cycle of the battery:
detecting whether a cell voltage of the battery cell reaches a charge final voltage before any other battery cell of the plurality of battery cells; and
detecting whether the cell voltage of the battery cell reaches a discharge final voltage before any other battery cell of the plurality of battery cells;
determining a number of charge/discharge cycles reaches a first reference count; and
in response to the number of charge/discharge cycles reaching the first reference count, determining a first count of how many times the battery cell reaches the charge final voltage before any other battery cell of the plurality of battery cells, and a second count of how many times the battery cell reaches the discharge final voltage before any other battery cell of the plurality of battery cells; and
determining that the battery cell is defective in response to a total of the first count and the second count being greater than or equal to a second reference count.

10. The method of claim 9, further comprising:
terminating charging in response to the battery cell reaching the charge final voltage before any other battery cell of the plurality of battery cells.

11. The method of claim 9, further comprising:
terminating discharging in response to the battery cell reaching the discharge final voltage before any other battery cell of the plurality of battery cells.

12. A method for detecting whether a battery cell in a battery including a plurality of battery cells is defective, by a battery management system, comprising:
for each charge/discharge cycle of the battery:
detecting whether a cell voltage of the battery cell reaches a charge final voltage before any other battery cell of the plurality of battery cells; and
detecting whether the cell voltage of the battery cell reaches a discharge final voltage before any other battery cell of the plurality of battery cells;
determining a number of charge/discharge cycles reaches a first reference count; and
when the number of the charge/discharge cycles reaches the first reference count, determining that the battery cell is defective in response to the battery cell reaching the charge final voltage before any other battery cell of the plurality of battery cells and reaching the discharge final voltage before any other battery cell of the plurality of battery cells within consecutive charge/discharge cycles of the battery.

13. The method of claim 12, wherein
determining that the battery cell is defective is further in response to the battery cell reaching the discharge final voltage before any other battery cell of the plurality of battery cells prior to the battery cell reaching the charge final voltage before any other battery cell of the plurality of battery cells.

14. The method for detecting the battery cell of claim 12, further comprising:
terminating charging in response to the battery cell reaching the charge final voltage before any other battery cell of the plurality of battery cells.

15. The method of claim 12, further comprising:
terminating discharging in response to the battery cell reaching the discharge final voltage before any other battery cell of the plurality of battery cells.

16. The method of claim 12, wherein
determining that the battery cell is defective is further in response to the battery cell reaching the charge final voltage before any other battery cell of the plurality of battery cells prior to the battery cell reaching the discharge final voltage before any other battery cell of the plurality of battery cells.

* * * * *